United States Patent
Kim et al.

(10) Patent No.: US 10,476,255 B2
(45) Date of Patent: *Nov. 12, 2019

(54) DC CIRCUIT BREAKER

(71) Applicant: HYOSUNG HEAVY INDUSTRIES CORPORATION, Seoul (KR)

(72) Inventors: Byung Choul Kim, Incheon (KR); Jung Ki Hong, Incheon (KR); Young Seong Han, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 232 days.

This patent is subject to a terminal disclaimer.

(21) Appl. No.: 15/540,982

(22) PCT Filed: Dec. 24, 2015

(86) PCT No.: PCT/KR2015/014296
§ 371 (c)(1),
(2) Date: Jun. 29, 2017

(87) PCT Pub. No.: WO2016/108530
PCT Pub. Date: Jul. 7, 2016

(65) Prior Publication Data
US 2017/0358917 A1 Dec. 14, 2017

(30) Foreign Application Priority Data
Dec. 29, 2014 (KR) .................... 10-2014-0192743

(51) Int. Cl.
*H02H 3/00* (2006.01)
*H02H 3/18* (2006.01)
(Continued)

(52) U.S. Cl.
CPC .............. *H02H 3/18* (2013.01); *H01H 9/54* (2013.01); *H01H 33/59* (2013.01); *H03K 17/56* (2013.01); *H04B 3/00* (2013.01)

(58) Field of Classification Search
None
See application file for complete search history.

(56) References Cited

U.S. PATENT DOCUMENTS

| | | | | |
|---|---|---|---|---|
| 5,793,586 A | * | 8/1998 | Rockot | H01H 33/596 361/8 |
| 5,892,342 A | * | 4/1999 | Friedlander | B60L 3/0023 318/139 |

(Continued)

FOREIGN PATENT DOCUMENTS

| | | |
|---|---|---|
| JP | 1984068128 A | 4/1984 |
| JP | 09-017294 A | 1/1997 |

(Continued)

*Primary Examiner* — Stephen W Jackson
(74) *Attorney, Agent, or Firm* — Novick, Kim & Lee, PLLC; Jae Youn Kim (57) ABSTRACT

Disclosed is a DC circuit breaker capable of interrupting fault currents flowing in both forward and backward directions. The DC circuit breaker includes: a mechanical switch installed on a DC transmission line and being opened to interrupt a current in the DC transmission line when a fault occurs at one side or remaining side thereof on the DC transmission line; a first bidirectional switching device connected in parallel with the mechanical switch and switching currents flowing in both forward and backward directions; an LC circuit connected in parallel with the mechanical switch and including a capacitor and a reactor connected in series to induce LC resonance; a first unidirectional switching device connected in parallel with the LC circuit and switching a current to induce LC resonance; and a second bidirectional switching device connected in series with the LC circuit and switching currents flowing in both forward and backward directions.

11 Claims, 9 Drawing Sheets

(51) Int. Cl.
*H01H 33/59* (2006.01)
*H01H 9/54* (2006.01)
*H03K 17/56* (2006.01)
*H04B 3/00* (2006.01)

(56) References Cited

U.S. PATENT DOCUMENTS

| | | |
|---|---|---|
| 9,450,397 B2 * | 9/2016 | Johansson ............... H01H 9/541 |
| 10,176,939 B2 * | 1/2019 | Park ........................ H01H 9/30 |
| 2014/0218832 A1 | 8/2014 | Yang et al. |

FOREIGN PATENT DOCUMENTS

| | | |
|---|---|---|
| JP | 2734886 B2 | 4/1998 |
| JP | 2012-195121 A | 10/2012 |
| KR | 10-2000-0060552 A | 10/2000 |
| KR | 10-1183508 B1 | 3/2011 |

\* cited by examiner

DC CIRCUIT BREAKER

TECHNICAL FIELD

The present invention relates to a direct current (DC) circuit breaker and, more particularly, to a DC circuit breaker capable of interrupting a fault current flowing through a DC transmission line in both directions with respect to a mechanical switch when a fault occurs on the DC transmission line.

BACKGROUND ART

A direct current circuit breaker (DC circuit breaker) is used to interrupt a fault current when a fault occurs on a direct current transmission line used as a high voltage transmission line. A direct current transmission line for a high voltage is used as a transmission line for a high voltage of 50 kV or higher of a high voltage direct current (HVDC) transmission system or a transmission line for a medium voltage of 50 kV or lower of a medium voltage direct current (MVDC) distribution system.

A DC circuit breaker is provided with a relatively inexpensive mechanical switch to interrupt a fault current when a fault occurs on a DC transmission line. The mechanical switch is opened to interrupt a fault current, thereby preventing a faulty system from influencing a normal system when a fault occurs in a high voltage direct current (HVDC) transmission system or a medium voltage direct current (MVDC) distribution system.

However, when the mechanical switch is opened to interrupt a fault current, an arc is generated in the mechanical switch due to a high voltage applied thereto. Once an arc is generated, a fault current continuously flows through the arc. Therefore, there is a problem that the fault current is not reliably interrupted.

In order to solve this problem, Korean Patent No. 1183508 and Japanese Patent Application Publication No. 1984-068128 propose DC circuit breakers that extinguish an arc generated in a mechanical switch using a resonance current. In the conventional DC circuit breakers, in order to interrupt a fault current, an arc generated when the mechanical switch is switched off due to a fault is extinguished using a technology in which the arc is extinguished by making a zero current which is formed by superposing a resonance current (reverse current) on a fault current flowing through the arc in the mechanical switch.

However, the conventional DC circuit breakers have a problem that interruption speed is slow because the resonance current is generated through multiple resonance cycles. In addition, since the conventional circuit breaker consists of a single resonance circuit and a single mechanical switch connected together, it is possible to interrupt only a fault current flowing in one direction with respect to the mechanical switch.

In addition, the conventional DC circuit breakers have a problem that they have a high transient recovery voltage (TRV), which is a voltage applied between two contacts of a circuit breaker after a fault current is interrupted. Specifically, as to a high voltage DC circuit breaker, after a fault current is interrupted, a high TRV is applied between two contacts thereof under a certain circuit condition of a system. In this case, for reliable interruption of a fault current, the DC circuit breaker needs to withstand the TRV so that no current can flow between the contacts thereof. However, since conventional DC circuit breakers have a high TRV, a dielectric breakdown between the contacts is likely to occur in the DC circuit breakers. In order to solve this problem, additional measures, such as injection of gas, are required.

DISCLOSURE

Technical Problem

Accordingly, the present invention has been made keeping in mind the above problems occurring in the prior art, and an object of the present invention is to provide a DC circuit breaker that can reliably interrupt a fault current in a mechanical switch without applying a resonance current to the mechanical switch when the mechanical switch in the DC circuit breaker is opened.

In addition, another object of the present invention is to provide a DC circuit breaker capable of interrupting a fault current flowing in both forward and backward directions when a fault occurs at one side or a remaining side thereof.

In addition, a further object of the present invention is to provide a DC circuit breaker capable of lowering a transient recovery voltage (TRV) applied between contacts thereof immediately after a fault current is interrupted by the DC circuit breaker.

Technical Solution

In order to accomplish the above object, the present invention provides a DC circuit breaker including: a mechanical switch installed on a DC transmission line and being opened to interrupt a current in the DC transmission line when a fault occurs at one side or a remaining side thereof on the DC transmission line; a first bidirectional switching device connected in parallel with the mechanical switch and switching currents flowing in both forward and backward directions; an LC circuit connected in parallel with the mechanical switch and including a capacitor and a reactor to induce LC resonance; a first unidirectional switching device, connected in parallel with the LC circuit, for switching a current flow, to induce LC resonance; and a second bidirectional switching device, connected in series with the LC circuit, for switching currents flowing in both forward and backward directions.

In the present invention, each of the first and second bidirectional switching devices includes a pair of power semiconductor switches that are turn-on/turn-off controllable, are arranged to be counter to each other, and are connected in parallel with each other, and the first unidirectional switching device includes a single power semiconductor switch that is turn-on/turn-off controllable.

In the present invention, when a fault occurs at the one side of the DC circuit breaker on the DC transmission line, in a state in which the mechanical switch is open and the second bidirectional switching device is in an OFF state, the first unidirectional switching device is turned on such that the capacitor is charged to a voltage −Vc through LC resonance between the capacitor and the reactor of the LC circuit, and subsequently the first unidirectional switching device is turned off and a first power semiconductor switch of the first bidirectional switching device and a third power semiconductor switch of the second bidirectional switching device are turned on such that a current is supplied through a closed circuit of the first power semiconductor switch and the third power semiconductor switch due to the voltage −Vc charged in the capacitor, thereby preventing a current from being supplied to the mechanical switch.

In the present invention, when a fault occurs at the one side of the DC circuit breaker on the DC transmission line, opening the mechanical switch and changing the capacitor to the voltage −Vc through the first unidirectional switching device that is turned on are simultaneously performed, or sequentially performed in this order or in a reverse order.

In the present invention, as a current is supplied to the first power semiconductor switch, a transient recovery voltage (TRV) generated in the mechanical switch is lowered by a reverse voltage that is applied between terminals of the mechanical switch due to the current supply to the first power semiconductor switch.

In the present invention, when a fault occurs at the remaining side on the DC transmission line, the mechanical switch is opened and a second power semiconductor switch of the first bidirectional switching device and a fourth power semiconductor switch of the second bidirectional switching device are turned on such that a current is supplied through a closed circuit of the second power semiconductor switch and the fourth power semiconductor switch due to a voltage +Vc charged in the capacitor, thereby preventing a current from being supplied to the mechanical switch.

In the present invention, when a fault occurs at the remaining side on the DC transmission line, opening the mechanical switch and supplying the current through the closed circuit of the second power semiconductor switch and the fourth power semiconductor switch using the voltage +Vc stored in the capacitor are simultaneously performed or sequentially performed in this order or a reverse order.

In the present invention, as a current is supplied to the second power semiconductor switch, a TRV generated in the mechanical switch is lowered by a reverse voltage that is applied between terminals of the mechanical switch due to the current supply to the second power semiconductor switch.

In the present invention, the DC circuit breaker further includes a second unidirectional switching device connected in parallel with the first unidirectional switching device and switching a current flowing in a reverse direction with respect to the current switched by the first unidirectional switching device to induce LC resonance in the LC circuit.

In the present invention, after a fault current is interrupted in the mechanical switch, the second unidirectional switching device is turned on such that the capacitor is charged to a voltage −Vc through the LC resonance caused by the capacitor and the reactor.

In the present invention, the DC circuit breaker further includes a resistor 160 installed between a ground and a contact point between the LC circuit 130 and the second bidirectional switching device 150.

Advantageous Effects

As described above, the present invention can reliably interrupt a fault current by easily and rapidly extinguishing an arc when the arc is generated during a switching operation of a mechanical switch provided in a DC circuit breaker In addition, the DC circuit breaker according to the present invention can interrupt fault currents flowing in both forward and backward directions with a single circuit.

In addition, the DC circuit breaker according to the present invention can lower a transient recovery voltage (TRV) applied between two contacts thereof immediately after a fault current is interrupted, thereby improving operation reliability for interruption of a fault current.

MODE FOR INVENTION

Hereinafter, a preferred embodiment of the present invention will be described with reference to the accompanying drawings. In addition, descriptions of known functions or constructions which have been deemed to unnecessarily obscure the gist of the present invention will be omitted below.

Figure 1:
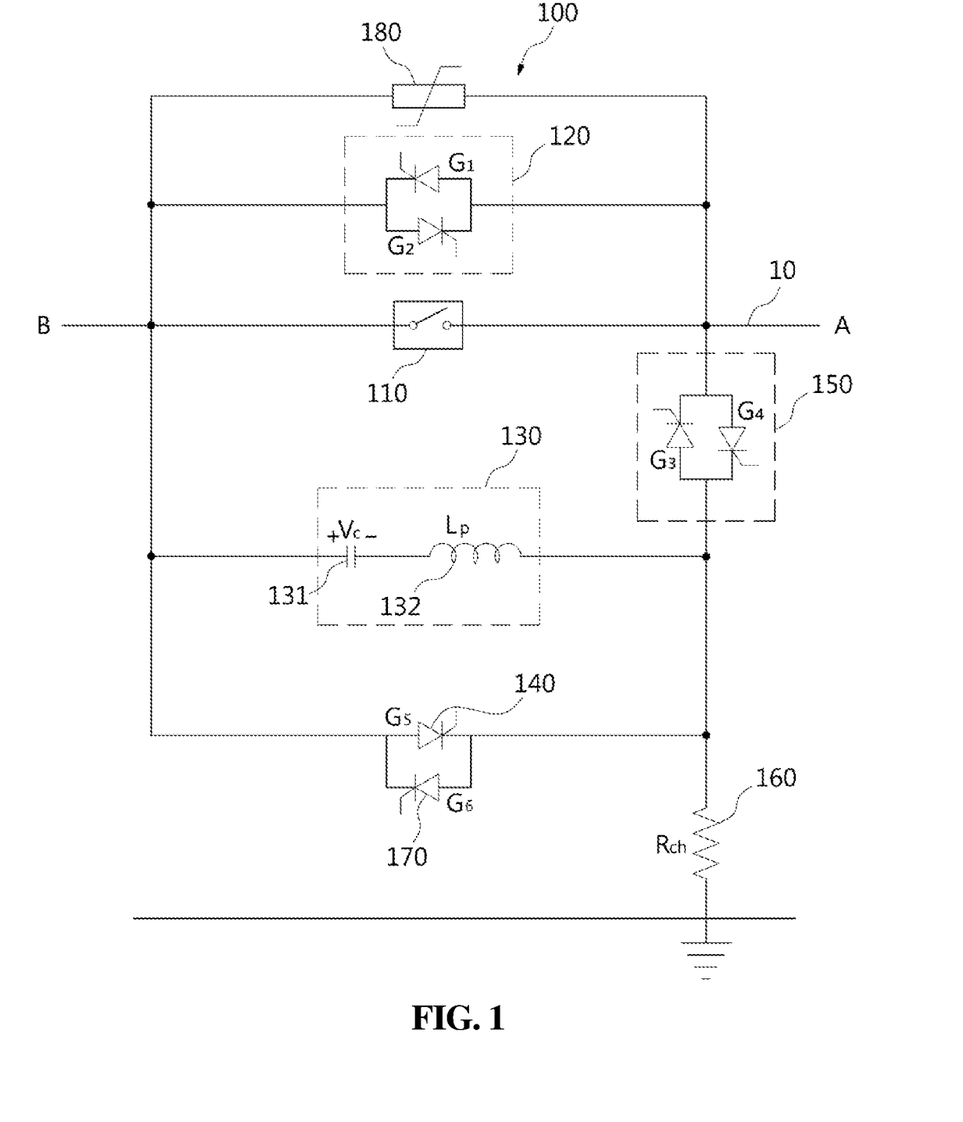
FIG. 1 is a configuration diagram of a DC circuit breaker according to one embodiment of the present invention.

FIG. 1 is a configuration diagram of a DC circuit breaker according to one embodiment of the present invention.

With reference to FIG. 1, according to one embodiment of the present invention, a direct current (DC) circuit breaker 100 includes a mechanical switch 110 installed on a DC transmission line 10 connecting a first side (A side) and a second side (B side) to each other. The mechanical switch 130 functions to block the DC transmission line 10 to prevent a fault current from being supplied to a faulty system when a fault occurs at the first side (A side) or the second side (B side). To this end, the mechanical switch 110 is closed in normal condition but opened to interrupt a current when a fault occurs. Operation of the mechanical switch 110 is controlled by a controller (not shown).

In addition, according to the embodiment, the DC circuit breaker 100 includes a first bidirectional switching device 120 connected in parallel with the mechanical switch 110. The first bidirectional switching device 120 switches currents flowing in both forward and backward directions, to the A side or the B side, according to the control of the controller (not shown). In the present embodiment, the first bidirectional switching device 120 includes two power semiconductor switches G1 and G2 connected in parallel with each other to switch currents flowing in both forward and backward directions. The two power semiconductor switches G1 and G2 are arranged to be counter to each other.

Since a high voltage is applied to the DC transmission line 10 according to the present invention, when the mechanical switch 110 is opened as a fault occurs at the A side or the B side, an arc is generated between two contacts of the mechanical switch 110. For this reason, although the mechanical switch 110 is open, a fault current can flow through the arc, thereby continuously flowing through the DC transmission line 10. Accordingly, according to the present invention, an additional device is used to reliably interrupt a fault current that is likely to flow through the arc.

Specifically, the DC circuit breaker 100 according to the embodiment of the present invention further includes an LC circuit 130 connected in parallel with the mechanical switch 110, a first unidirectional switching device 140 that is connected in parallel with the LC circuit 130 and which switches a current to induce LC resonance, and a second bidirectional switching device 150 connected in series with the LC circuit 130 and switching currents flowing in both forward and backward directions. Herein, according to another embodiment, the DC circuit breaker 100 may further include a second unidirectional switching device 170 that is connected in parallel with the first unidirectional switching device 140 and which switches a reverse current which is counter to the current switched by the first unidirectional switching device 140 to induce LC resonance in the LC circuit 150.

The LC circuit 130 includes a capacitor 131 and a reactor 132 connected in series. The capacitor 131 and the reactor 132 cause LC resonance in accordance with switching operations of the first unidirectional switching device 140 or the second unidirectional switching device 170. The capacitor 131 can be charged in various ways. For example, the capacitor 131 can be charged by a current flowing through the DC transmission line or by an additional charging circuit.

The second bidirectional switching device 150 includes two power semiconductor switches G3 and G4 connected in parallel with each other to switch between currents flowing in both forward and backward directions. The two power semiconductor switches G3 and G4 are arranged to be counter to each other. The first and second unidirectional switching devices 140 and 160 respectively include a single power semiconductor switch G5 and a single power semiconductor switch G6, thereby controlling the flow of a current in a single direction. Although not illustrated in the drawings, switching operations of the power semiconductor switches G3 to G6 are controlled by the controller (not shown).

In the embodiment, the power semiconductor switches G1 to G6 are turn-on controllable devices, and may be implemented as thyristors, for example. Alternatively, the power semiconductor switches G1 to G6 are turn-on/turn-off controllable devices and may be implemented as gate turn-off thyristors (GTO), insulated gate commutated thyristors (IGCT), or insulated gate bipolar transistors (IGBT), for example.

In addition, in the DC circuit breaker 100 according to the present invention, a resistor 160 is connected between a ground GND and a contact point between the LC circuit 130 and the second bidirectional switching device 150. The capacitor 131 of the LC circuit 130 is initially charged to a voltage +Vc through the resistor 160. That is, in initial normal condition, the mechanical switch 110 is closed and the capacitor 131 is charged to the voltage +Vc by the current flowing through the DC transmission line. Charging the capacitor 131 using the resistor 160 is only an example. According to another example, the capacitor 131 may be charged in various ways. For example, the capacitor 131 can be charged using an external power source or an additional charging circuit (not shown).

In the embodiment, a resistor 180 is connected in parallel with the mechanical switch 110. Thus, when the mechanical switch 110 is opened to interrupt a current, the resistor 180 prevents an overvoltage higher than a rated voltage from being applied between terminals of the DC circuit breaker 100. That is, when a high voltage that is equal to or higher than a predetermined reference voltage is applied between the terminals of the DC circuit breaker 100 due to a certain fault, the high voltage is consumed by the resistor 200. The resistor 120 may be a varistor, a surge arrester, or the like.

FIGS. 2A to 2D are schematic diagrams illustrating a fault current interruption process when a fault occurs at one side (A side) of the DC circuit breaker according to the embodiment of the present invention, and FIGS. 3A to 3D are schematic diagrams illustrating a fault current interruption process when a fault occurs at the remaining side (B side) of the DC circuit breaker according to the embodiment of the present invention.

Figure 2A:
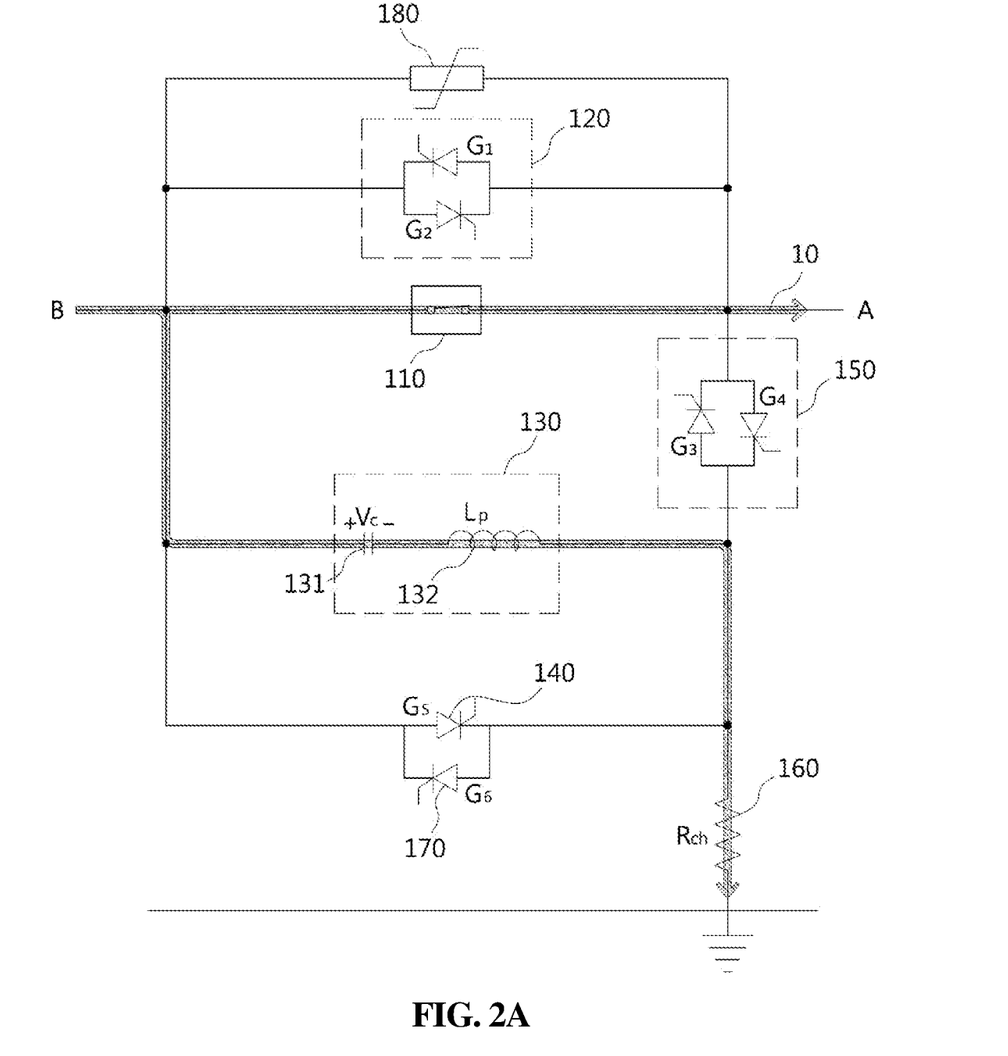
FIGS. 2A to 2D are schematic diagrams illustrating a fault current interruption process in the DC circuit breaker of the embodiment of the present invention when a fault occurs at one side of the DC circuit breaker on a DC transmission line.

First, as illustrated in FIG. 2A, in normal condition, the mechanical switch 110 of the DC circuit breaker 100 is closed. In addition, the first unidirectional switching device 140 and the second bidirectional switching device 150 are turned off. Therefore, when a voltage is applied to the DC transmission line 10, a normal current flows through the DC transmission line 10 via the mechanical switch 110, and a current also flows through the capacitor 131 and the reactor 132 of the LC circuit 130 and the resistor 160, whereby the capacitor 131 is charged to the voltage +Vc.

Figure 2B:
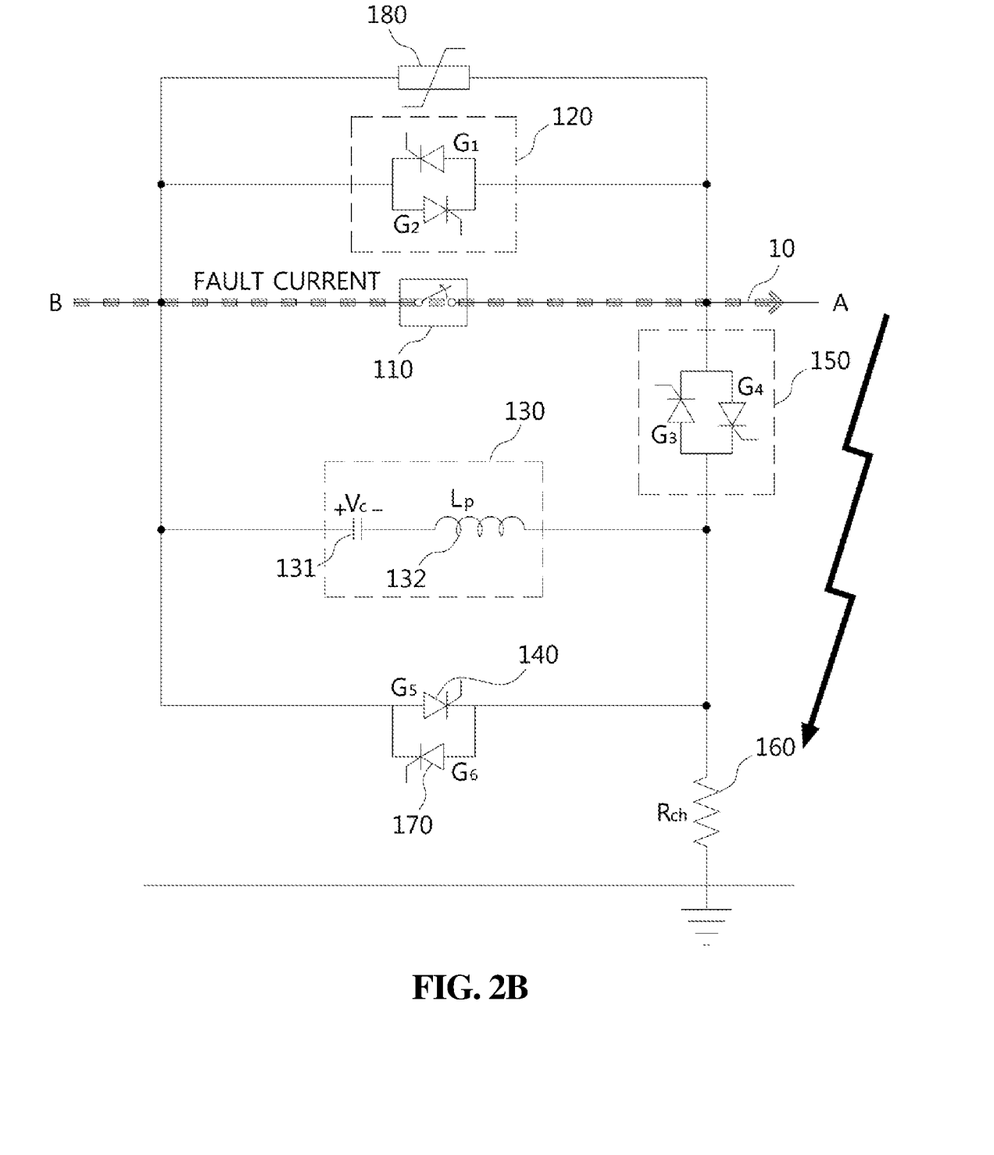

When a fault occurs at one side (B side) in this state, the controller (not shown) detects the fault and opens the mechanical switch 110 to interrupt a fault current in the DC transmission line 10, as illustrated in FIG. 2B. When the mechanical switch 110 is opened, an arc is generated between the contacts of the mechanical switch 110, resulting in a fault current continuously flowing from the A side to the B side.

Figure 2C:
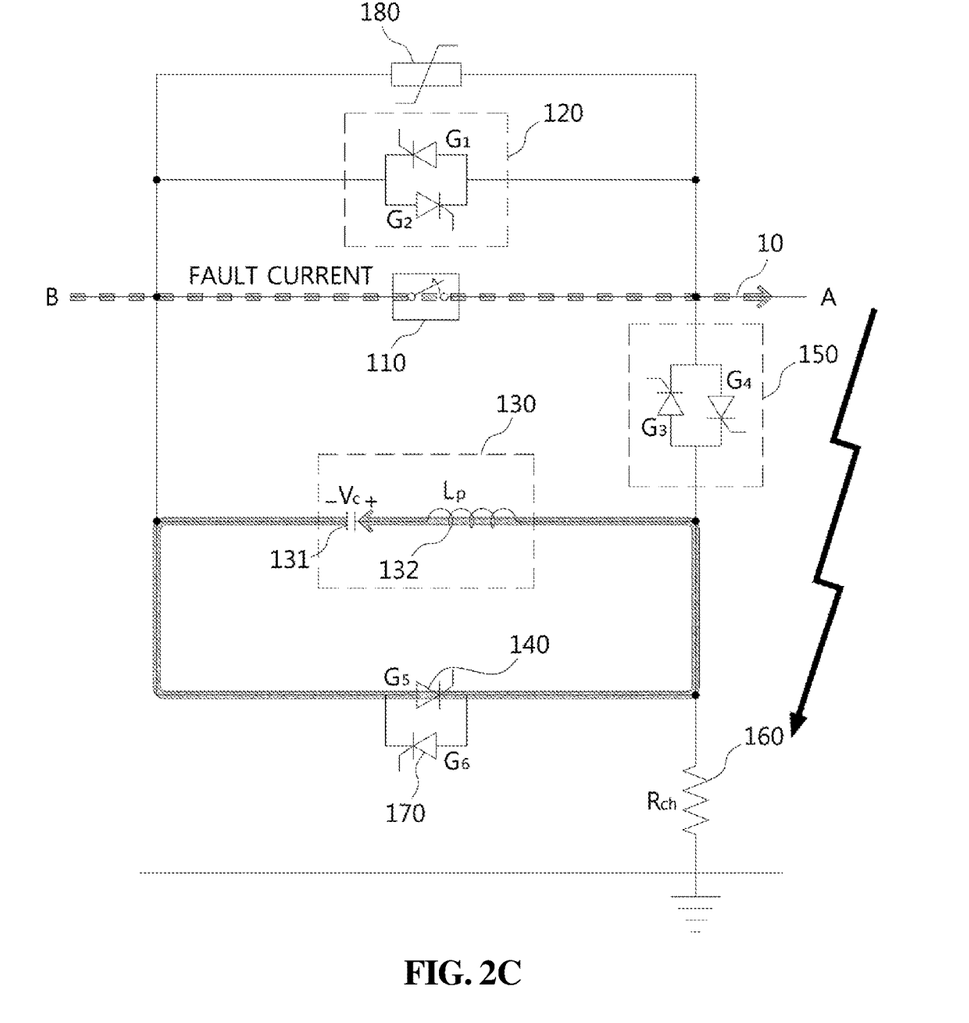

At this point, as illustrated in FIG. 2C, the pair of power semiconductor switches G3 and G4 of the second bidirectional switching device 150 are turned off, and the power semiconductor switch G5 of the first unidirectional switching device 140 is turned on. Thus, LC resonance occurs between the reactor 132 and the capacitor 131 through the power semiconductor switch G5 of the first unidirectional switching device 140, and, as a result, the capacitor 131 is charged to a voltage −Vc.

Figure 2D:
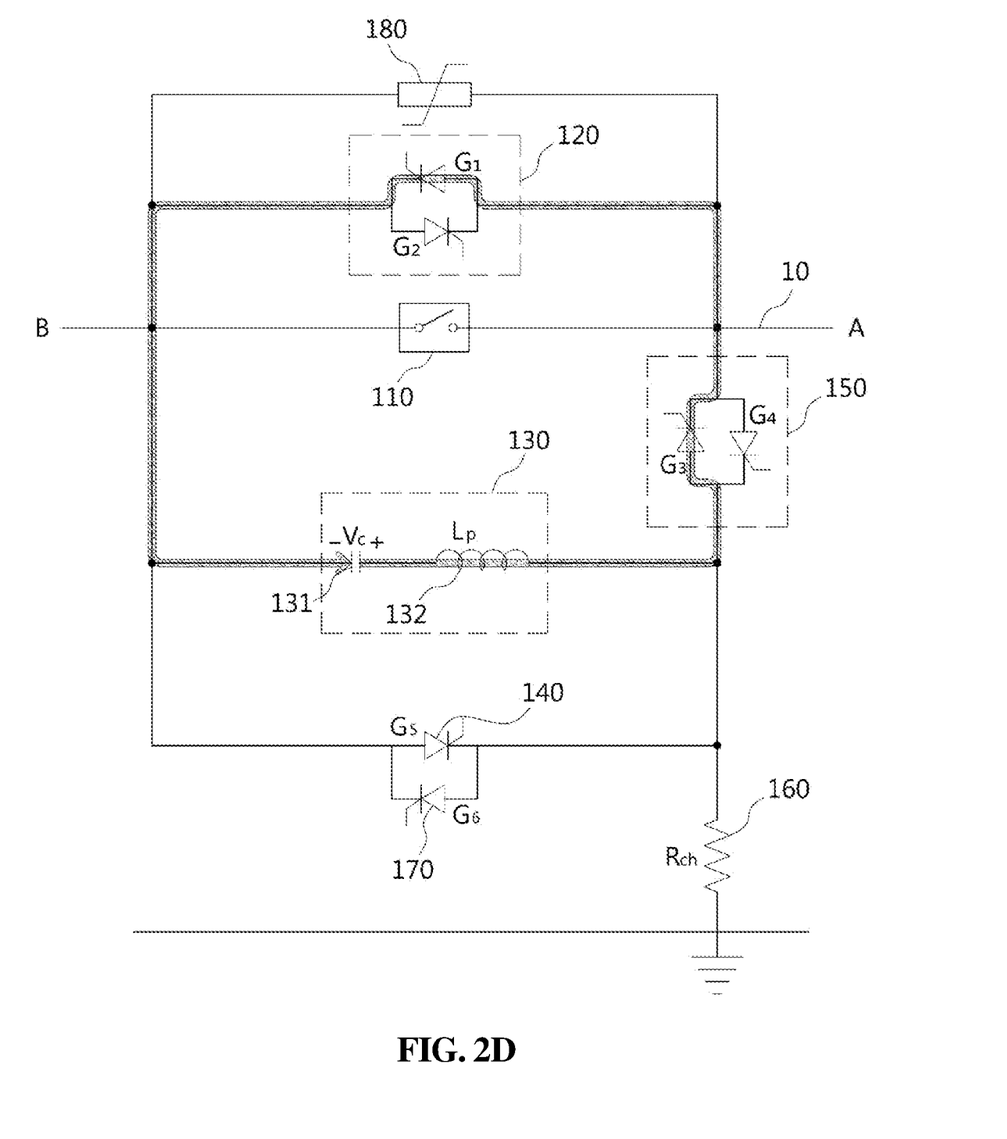

Afterwards, as illustrated in FIG. 2D, the first unidirectional switching device 140 is turned off, and the power semiconductor switch G3 of the second bidirectional switching device 150 is turned on. Thus, due to the voltage −Vc charged in the capacitor 131, a current flows along a closed circuit including the power semiconductor switch G3 of the second bidirectional switching device 150 and the power semiconductor switch G1 of the first bidirectional switching device 120. Therefore, the current is not supplied to the mechanical switch 110. The magnitude of the current is determined depending on the capacity of the capacitor 131.

In this state, as illustrated in FIG. 2D, due to the voltage −Vc charged in the capacitor 131, a current is supplied to the power semiconductor switch G1 of the first bidirectional switching device 120, so a reverse voltage is applied between terminals of the mechanical switch 110 with contacts being open. That is, since the reverse voltage, which is reverse to a transient recovery voltage (TRV) that is applied between the terminals of the mechanical switch 110 after a fault current is interrupted in the mechanical switch 110, is applied, the TRV is lowered. Namely, it is possible to reliably interrupt a fault current by lowering the TRV of the mechanical switch 110 in this way. Thus, it is possible to solve a problem of conventional arts that required an additional extinguishing device due to a high TRV attributable to the fact that it is difficult to apply a reverse voltage between two contacts.

Meanwhile, when the mechanical switch 110 interrupts a current, a voltage at the A side rapidly rises to be higher than that at the B side. The increased voltage at the A side is consumed by the resistor 180 connected in parallel with the mechanical switch 110. In addition, the second unidirectional switching device 170 is selectively turned on to induce LC resonance in the LC circuit 130, resulting in the capacitor 131 being charged again to the voltage +Vc.

In the DC circuit breaker 100 according to the embodiment of the present invention, reclosing the mechanical switch 110 is possible. Namely, when the fault at the B side is fixed, the controller (not shown) closes the mechanical switch 110 to reclose the DC transmission line 10. When the mechanical switch 110 is closed to form a closed circuit, in the case in which the fault is not properly fixed or a fault occurs again, the fault current interruption process is performed again. The reclosing is possible because the capacitor 131 of the LC circuit 130 is maintained at a charged state (+Vc) after the fault current is interrupted in the mechanical switch 110.

Figure 3A:
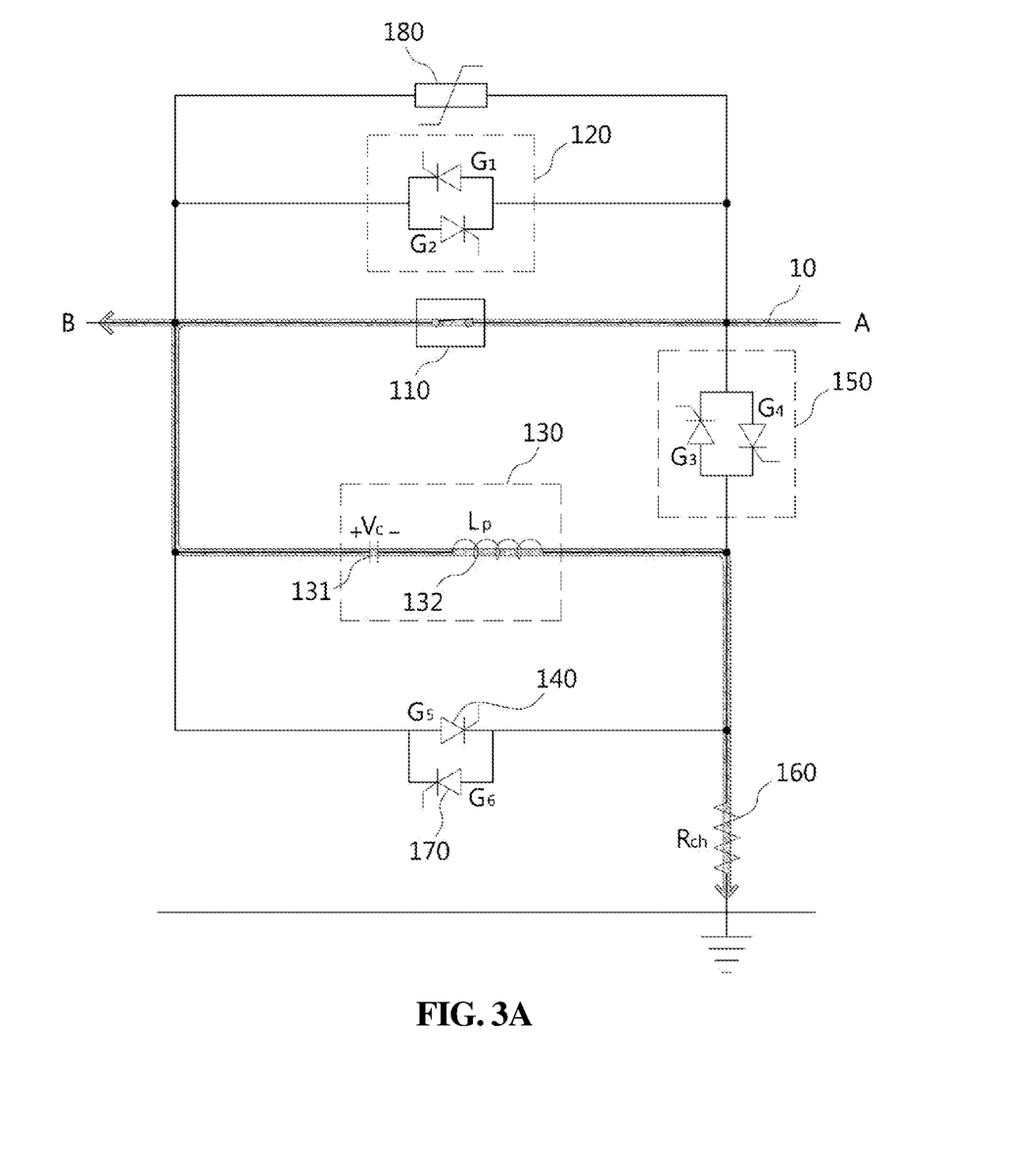
FIGS. 3A to 3D are schematic diagrams illustrating a fault current interruption process in the DC circuit breaker when a fault occurs at a remaining side of the DC circuit breaker on the DC transmission line.

Next, with reference to FIGS. 3A to 3D, the case in which a fault occurs at the remaining side (A side) will be described as another embodiment. First, in a normal condition as illustrated in FIG. 3A, the mechanical switch 110 of the DC circuit breaker 100 is closed. The first unidirectional switching device 120 and the second bidirectional switching device 150 are in an OFF state. Accordingly, when a voltage is applied to the DC transmission line 10, a normal current flows through the DC transmission line 10 via the mechanical switch 110, and a current also flows through the capacitor 131 and the reactor 132 of the LC circuit 130, and the resistor 160. Thus, the capacitor 131 is charged to the voltage +Vc.

Figure 3B:
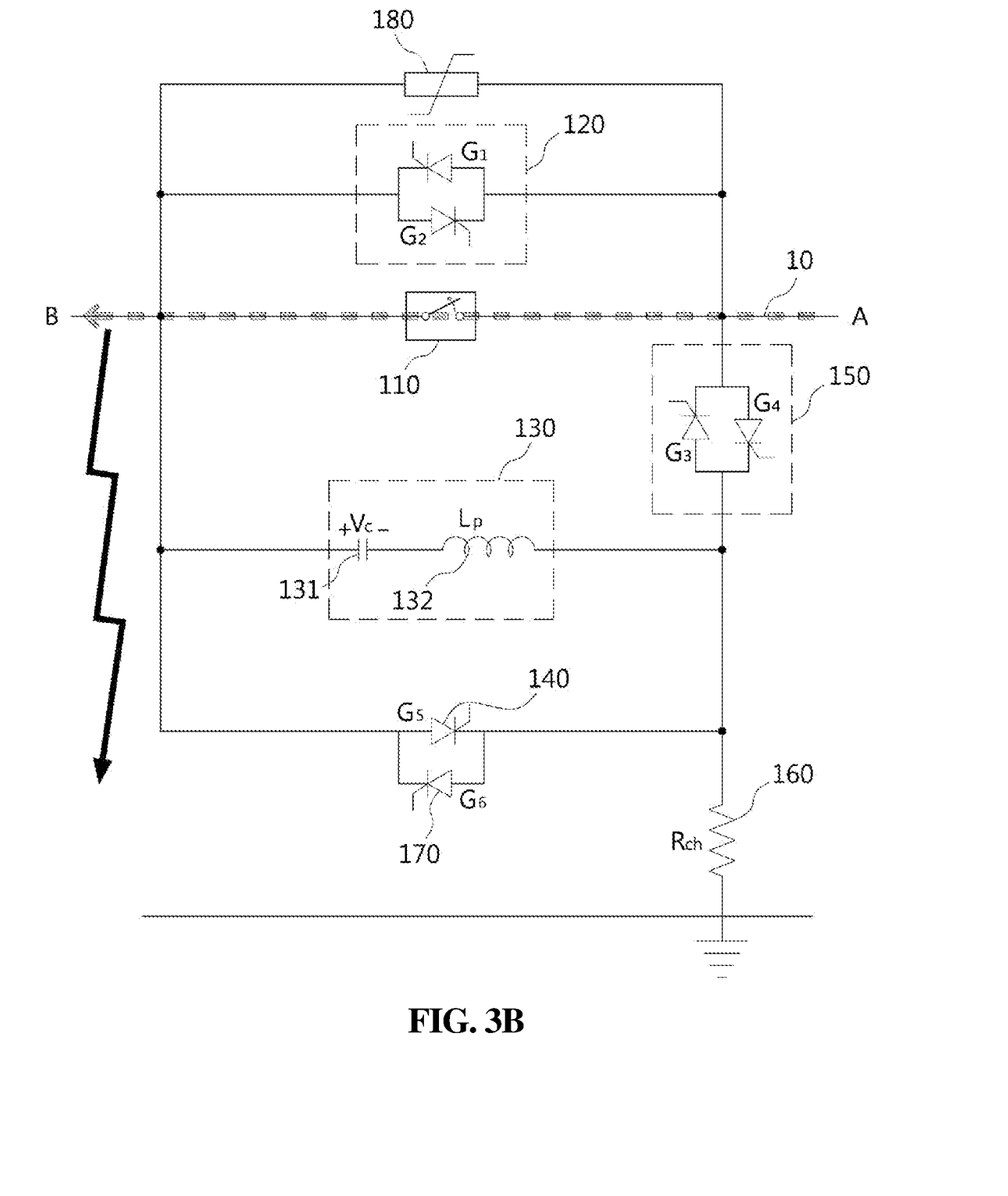

When a fault occurs at the remaining side (A side) in this state, the controller (not shown) detects the fault and opens the mechanical switch 110 to interrupt a fault current flowing through the DC transmission line 10, as illustrated in FIG. 3B. When the mechanical switch 110 is opened, an arc is generated between the contacts of the mechanical switch 110, so a fault current continuously flows from the B side to the A side through the arc.

Figure 3C:
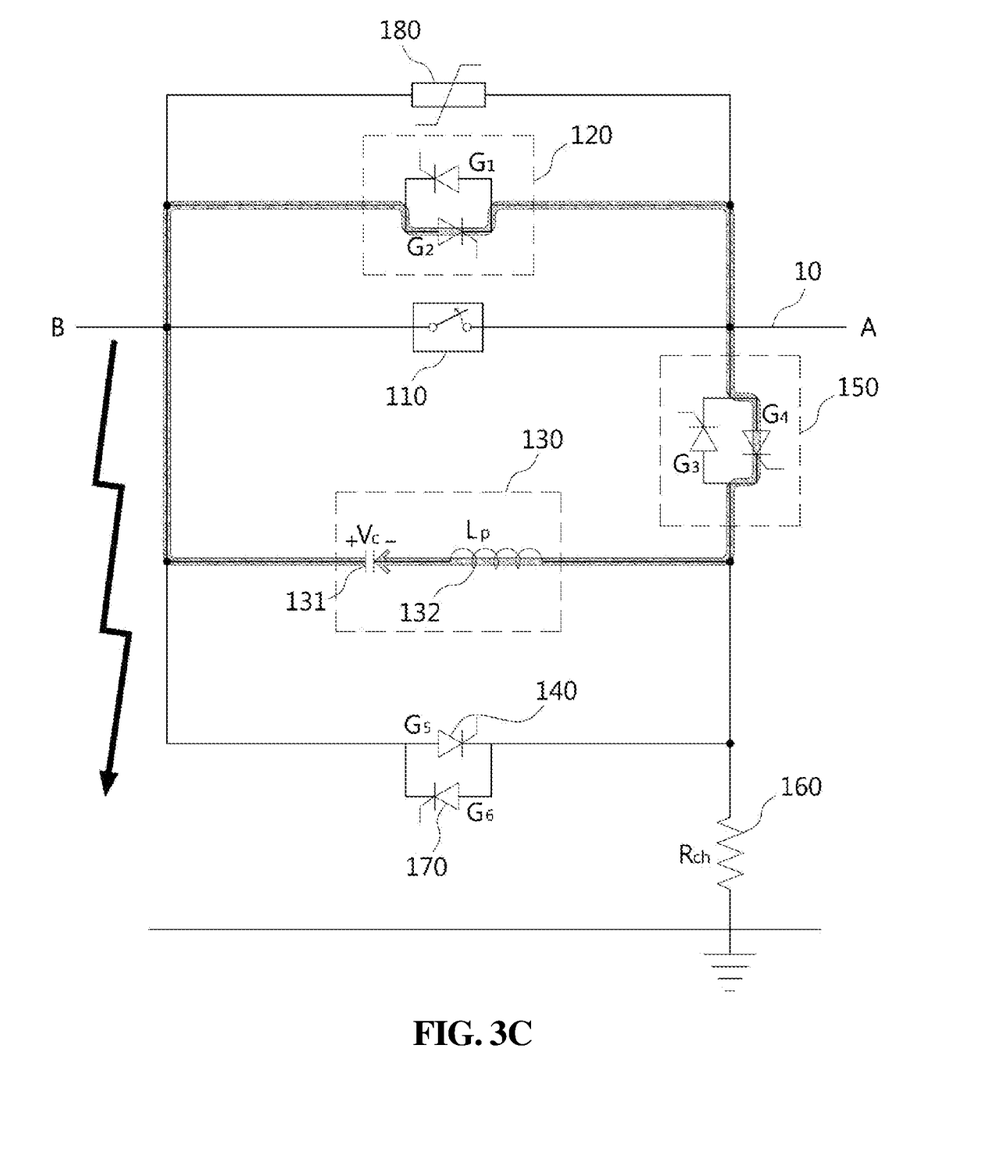

At this point, as illustrated in FIG. 3C, the first unidirectional switching device 140 is turned off, and the power semiconductor switch G4 of the second bidirectional switching device 150 is turned on. Therefore, due to the voltage +Vc charged in the capacitor 131, a current flows along a closed circuit including the power semiconductor switch G4 of the second bidirectional switching device 150 and the power semiconductor switch G2 of the first bidirectional switching device 120. That is, the current cannot be supplied to the mechanical switch 110 that is open.

In this case, as illustrated in FIG. 3C, due to the voltage +Vc charged in the capacitor 131, the current flows to the power semiconductor switch G2 of the first bidirectional switching device 120 and thus a reverse voltage is applied between terminals of the mechanical switch 110 with contacts thereof being open. That is, since the reverse voltage with respect to the TRV, which is a voltage applied between the contacts of the mechanical switch 110 after the fault current is interrupted in the mechanical switch 110, is applied, the TRV is lowered. Namely, it is possible to reliably interrupt a fault current by lowering the TRV applied to the mechanical switch 110.

Figure 3D:
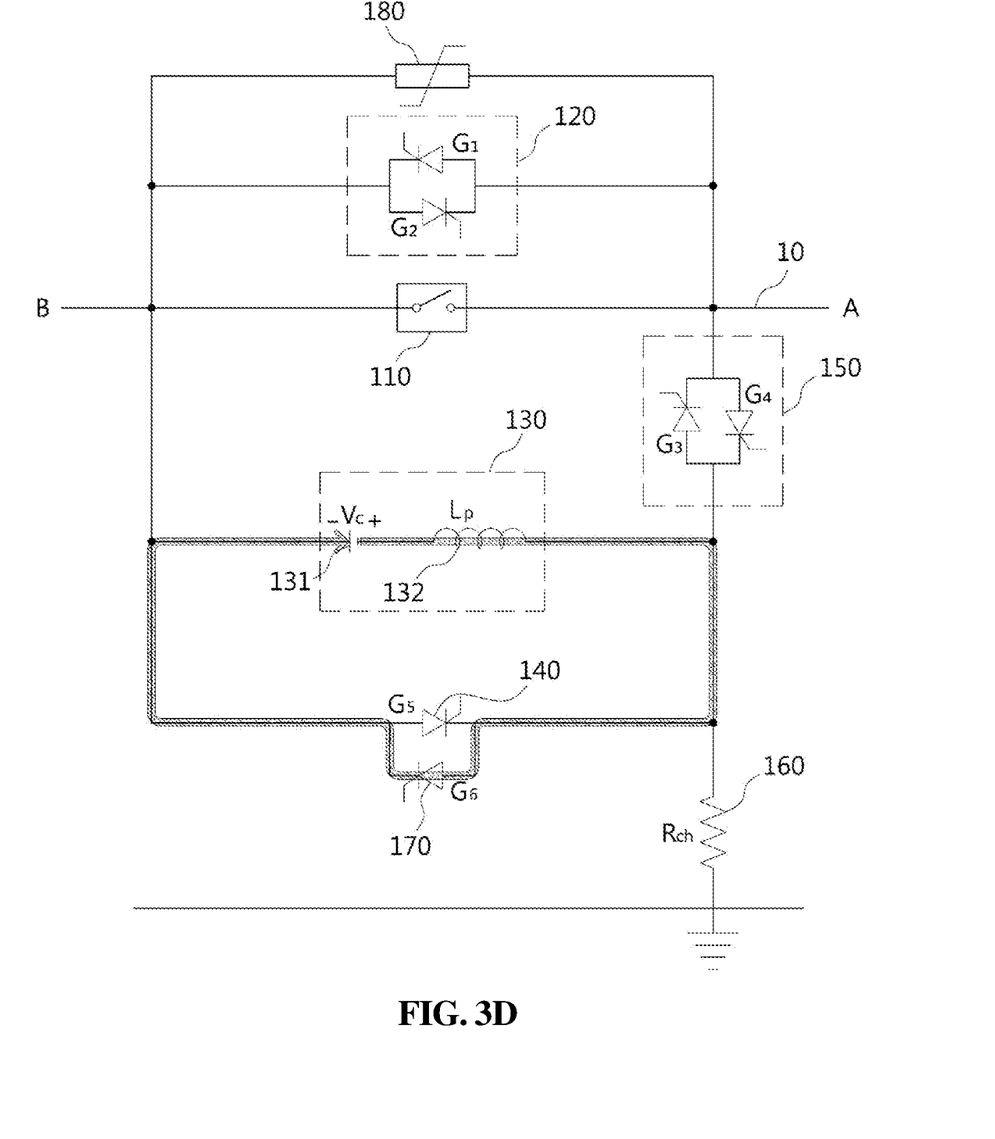

On the other hand, when the fault current is interrupted in the mechanical switch 110, the voltage at the B side rapidly rises to be higher than that at the A side. The increased voltage at the B side is consumed by the resistor 180 connected in parallel with the mechanical switch 110. In addition, as illustrated in FIG. 3D, the second unidirectional switching device 170 may be selectively turned on to induce LC resonance in the LC circuit 130 so that the capacitor 151 can be recharged to the voltage −Vc.

In the DC circuit breaker 100 according to the embodiment of the present invention, the mechanical switch 110 can be reclosed. That is, when a fault at the A side is fixed, the controller (not shown) closes the mechanical switch 110, thereby forming a closed circuit in the DC transmission line 10 again. In the case in which a closed circuit is formed by closing the mechanical switch 110, when the fault is not properly fixed or a fault occurs again at the A side, the above-described process is repeated again.

Although the present invention has been described above in connection with preferred embodiments, the present invention is not limited to the above embodiments. Those skilled in the art will appreciate that various modifications, additions, and substitutions are possible, without departing from the scope and spirit of the present invention as disclosed in the appended claims, and all of those modifications, additions, and substitutions also fall within the technical scope of the present invention. Accordingly, the substantial technical protection scope of the present invention should be defined by the technical spirit of the appended claims.

The invention claimed is:

1. A DC circuit breaker comprising:
a mechanical switch installed on a DC transmission line and being opened to interrupt a current in the DC transmission line when a fault occurs at one side or a remaining side thereof on the DC transmission line;
a first bidirectional switching device, connected in parallel with the mechanical switch, for switching currents flowing in both forward and backward directions;
an LC circuit connected in parallel with the mechanical switch and including a capacitor and a reactor connected in series with each other to induce LC resonance;
a first unidirectional switching device, connected in parallel with the LC circuit, for switching a current, to induce LC resonance; and
a second bidirectional switching device, connected in series with the LC circuit, for switching currents flowing in the both forward and backward directions.

2. The DC circuit breaker according to claim 1, wherein the first and second bidirectional switching devices respectively include a first power semiconductor switch and a second power semiconductor switch that are turn-on/turn-off controllable, are connected in parallel, and are arranged to be counter to each other and a pair of power semiconductor switches that are turn-on/turn-off controllable are connected in parallel, and are arranged to be counter to each other, and wherein the first unidirectional switching device includes a single power semiconductor switch that is turn-on/turn-off controllable.

3. The DC circuit breaker according to claim 2, wherein when a fault occurs at the one side on the DC transmission line, in a state in which the mechanical switch is open and the second bidirectional switching device is in an OFF state, the first unidirectional switching device is turned on such that the capacitor is charged to a voltage Vc through LC resonance in the capacitor and the reactor, and subsequently the first unidirectional switching device is turned off and the first power semiconductor switch of the first bidirectional switching device and a third power semiconductor switch of the second bidirectional switching device are turned on such that a current is supplied through a closed circuit of the first power semiconductor switch and the third power semiconductor switch due to the voltage Vc charged in the capacitor, thereby preventing a current from being supplied to the mechanical switch.

4. The DC circuit breaker according to claim 3, wherein when a fault occurs at the one side on the DC transmission line, opening the mechanical switch and changing the capacitor to the voltage −Vc through the first unidirectional switching device that is turned on are simultaneously performed, or sequentially performed in this order or in a reverse order.

5. The DC circuit breaker according to claim 3, wherein as a current is supplied to the first power semiconductor switch, a transient recovery voltage generated in the mechanical switch is lowered by a reverse voltage applied between terminals of the mechanical switch.

6. The DC circuit breaker according to claim 2, wherein when a fault occurs at the remaining side on the DC transmission line, the mechanical switch is opened and the second power semiconductor switch of the first bidirectional switching device and a fourth power semiconductor switch of the second bidirectional switching device are turned on such that a current is supplied through a closed circuit of the second power semiconductor switch and the fourth power semiconductor switch due to a voltage +Vc charged in the capacitor, thereby preventing a current from being supplied to the mechanical switch.

7. The DC circuit breaker according to claim 6, wherein when a fault occurs at the remaining side on the DC transmission line, opening the mechanical switch and supplying the current through the closed circuit of the second power semiconductor switch and the fourth power semiconductor switch using the voltage +Vc stored in the capacitor are simultaneously performed or sequentially performed in this order or a reverse order.

8. The DC circuit breaker according to claim 6, wherein as a current is supplied to the power semiconductor switch, a transient recovery voltage generated in the mechanical switch is lowered by a reverse voltage applied between terminals of the mechanical switch.

9. The DC circuit breaker according to claim 6, further comprising a second unidirectional switching device connected in parallel with the first unidirectional switching device and switching a current flowing in a reverse direction with respect to the current switched by the first unidirectional switching device to induce LC resonance in the LC circuit.

10. The DC circuit breaker according to claim 9, wherein after a fault current is interrupted in the mechanical switch, the second unidirectional switching device is turned on such that the capacitor is charged to a voltage −Vc through the LC resonance in the capacitor and the reactor.

11. The DC circuit breaker according to claim 1, further comprising a resistor installed between a ground and a contact point between the LC circuit and the second bidirectional switching device.

* * * * *